United States Patent [19]
Lang-Dahlke

[11] Patent Number: 5,283,605
[45] Date of Patent: Feb. 1, 1994

[54] DEVICE FOR TESTING CONTACTING AND/OR WIRING OF SOCKETS ON A CIRCUIT BOARD

[76] Inventor: Helmut Lang-Dahlke, Burkheimer Str. 9, D-7800 Freiburg, Fed. Rep. of Germany

[21] Appl. No.: 888,049

[22] Filed: May 21, 1992

[30] Foreign Application Priority Data

May 21, 1991 [DE] Fed. Rep. of Germany ....... 4116457

[51] Int. Cl.⁵ ............................................ G01R 31/02
[52] U.S. Cl. ............................ 324/158 F; 324/158 P; 324/538
[58] Field of Search .............. 324/158 F, 158 P, 72.5, 324/537, 538; 439/71, 140, 912.1; 361/393, 398

[56] References Cited

U.S. PATENT DOCUMENTS

| | | | |
|---|---|---|---|
| 4,460,236 | 7/1984 | Strautz | 439/912.1 |
| 4,516,072 | 5/1985 | Marpoe, Jr. | 324/158 F |
| 4,674,006 | 6/1987 | Duller et al. | 361/393 |
| 4,846,702 | 7/1989 | Ignariak et al. | 439/71 |
| 4,978,912 | 12/1990 | Vonder et al. | 324/158 F |
| 5,122,070 | 6/1992 | Lebris et al. | 324/158 F |

FOREIGN PATENT DOCUMENTS

| | | |
|---|---|---|
| 8417765 | 6/1984 | Fed. Rep. of Germany . |
| 3340180 | 5/1985 | Fed. Rep. of Germany . |
| 3533810 | 9/1985 | Fed. Rep. of Germany . |
| 8911411 | 9/1989 | Fed. Rep. of Germany . |

Primary Examiner—Vinh Nguyen

[57] ABSTRACT

A device for testing contacting and/or wiring of sockets connected to a circuit board includes a housing with oppositely arranged inner side walls. First guiding elements are connected to the inner side walls and are spaced at a certain grid distance from one another. At least one testing adaptor is connected to the housing for testing one of the sockets. The testing adaptor has a flat casing with a forward end and opposite longitudinal narrow sides. A testing head is connected to the forward end. The casing further has second guiding elements connected to the longitudinal narrow sides whereby the first and the second guiding elements are slidably connected such that the testing head is movable toward and attachable to the socket for establishing electrical contact. Between the first and the second guiding elements an intermediate member is inserted. The intermediate member has a third guiding element and a fourth guiding element oppositely oriented relative to one another. The third guiding element engages the first guiding element and the fourth guiding element engages the second guiding element.

18 Claims, 4 Drawing Sheets

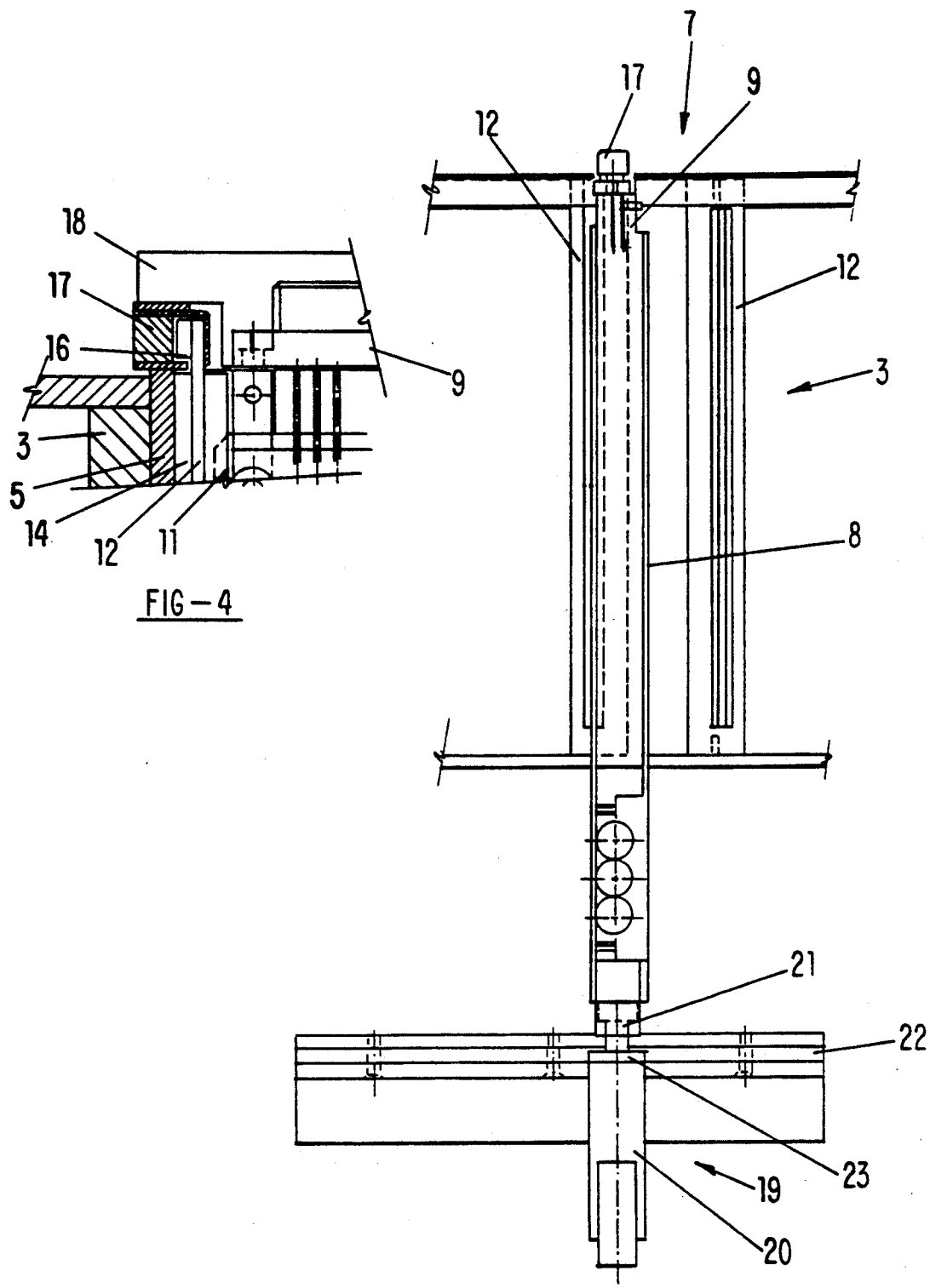

DEVICE FOR TESTING CONTACTING AND/OR WIRING OF SOCKETS ON A CIRCUIT BOARD

BACKGROUND OF THE INVENTION

The present invention relates to a device for testing contacting and/or wiring of sockets arranged in an array on a circuit board, especially for testing contacting of sockets for electronic cards, the device having a housing that is provided with parallel first guiding elements connected to oppositely arranged inner side walls of the housing and being spaced at a certain grid distance from one another. The device further comprises at least one testing adapter connected to an evaluation circuit and coordinated with respective sockets to be tested. The testing adaptor is comprised of a flat casing having at its forward end a testing head which is preferably exchangeably connected. The casing is provided with second guiding elements on its longitudinal narrow sides such that the first and the second guiding elements are slidably connected for moving and attaching the testing head to the sockets in order to establish electrical contact.

In today's microelectronics technology, it is known and common practice to provide an array of sockets in a plurality of rows, for example, in order to be able to attach thereto so-called electronic cards in a contacting manner. One commonly encountered problem is that after arranging the sockets on the circuit board it is uncertain whether the contacting and/or wiring has been effected properly. For this reason, it is necessary to perform an electrical tests.

A known testing device comprises a number of testing adapters which corresponds to the number of the sockets to be tested. The testing adapters are comprised of a casing having at their forward end a testing head connected thereto in an exchangeable manner. In order to reduce the length of the leads between the testing head and the measuring device, the switching electronics is integrated into the casing of the testing adaptor. Alternatively, it is also possible to provide the casing only with the wiring while the switching electronics is provided externally. The testing head comprises respective pins or spring contacts and is attached to the respective socket via these pins or spring contacts in order to carry out the required test. For this purpose, a housing corresponding to the circuit board with the array of sockets is provided. The housing has parallel guiding grooves provided at oppositely arranged inner side walls. The guiding grooves are spaced from one another at a certain grid distance. Due to the respective division, a continuous grid is created. Corresponding to the guiding grooves at oppositely arranged inner side walls of the housing are longitudinal ledges provided at the testing adaptor in the area of the longitudinal narrow sides. Via these ledges the testing adaptor is insertable into the guiding grooves of the housing. Since the guiding grooves form a grid, the positions of the testing adapters are adaptable to different circuit boards to be tested.

The disadvantage of this known testing device lies in the fact that in order to be able to displace the testing adapters for an adaptation to a different circuit board to be tested, these testing adapters must be completely removed and pulled from the guiding grooves of the housing and must be repositioned at respective new positions. This is disadvantageous because cables are arranged at the upper end of the testing adaptor which make the removal of the testing adaptor more difficult and cumbersome. A further disadvantage of the known testing device is that the testing adaptor can only be displaced by the given grid distance. This grid distance, which is defined by the guiding grooves at the housing, however, may not be reduced to a very small distance because otherwise the protrusions between the guiding grooves are too thin to provide sufficient stability.

It is therefore an object of the present invention to improve the known testing device such that in a simple manner a testing adaptor may be newly positioned.

BRIEF DESCRIPTION OF THE DRAWINGS

This object, and other objects and advantages of the present invention, will appear more clearly from the following specification in conjunction with the accompanying drawings, in which:

FIG. 4 shows a detailed view of the testing device according to FIG. 3; and

FIG. 5 is a view of a testing device according to FIG. 3 perpendicular to the representation of FIG. 3.

SUMMARY OF THE INVENTION

Figure 1:
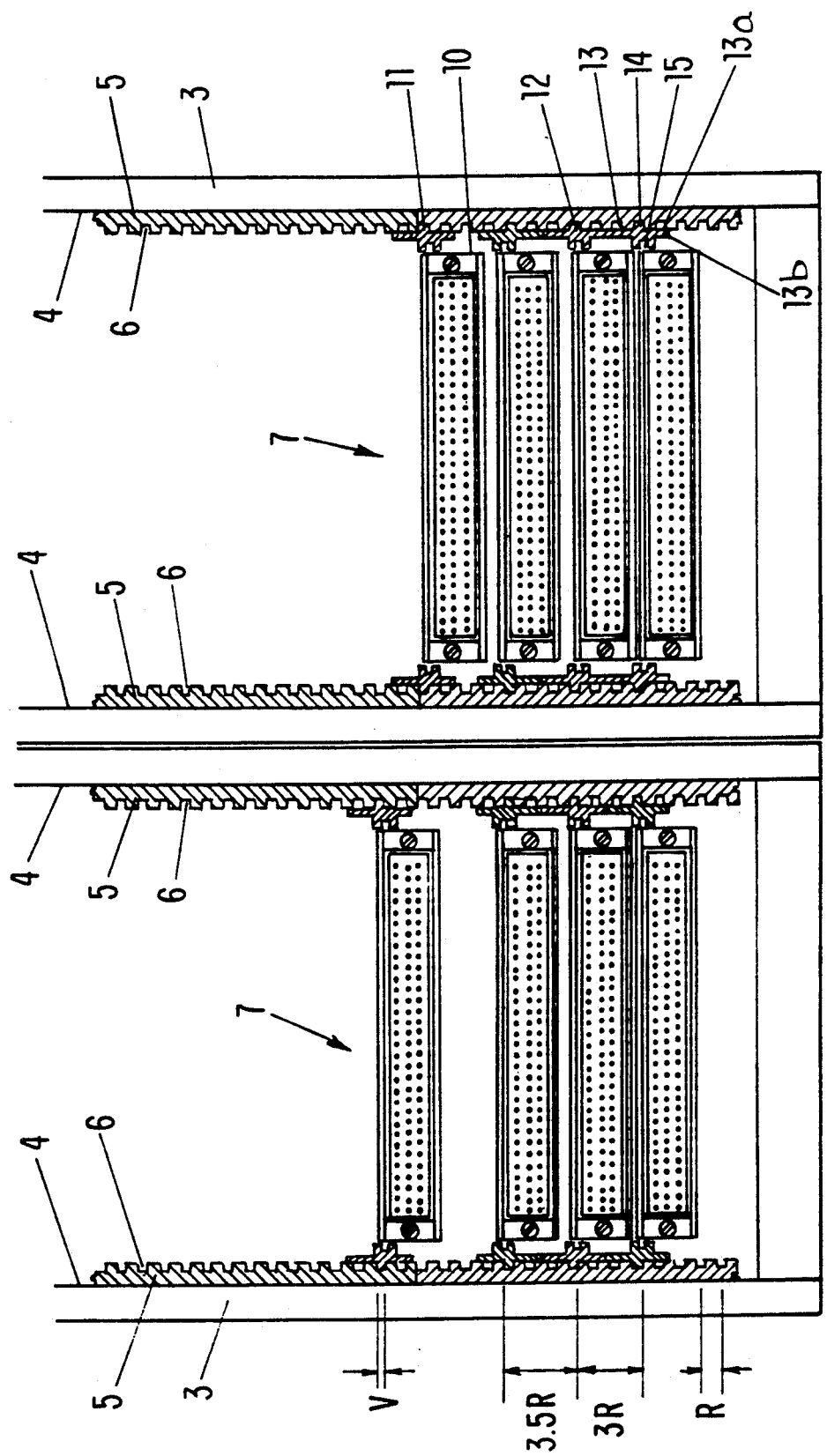
FIG. 1 is a schematic plan view of a first embodiment of the testing device.

The testing device of the present invention is primarily characterized by a housing with oppositely arranged inner side walls; parallel first guiding elements connected to the inner side walls and spaced at a certain grid distance from one another; at least one testing adaptor connected to the housing for testing one of the sockets, the testing adaptor comprising a flat casing with a forward end and opposite longitudinal narrow sides, and a testing head connected to the forward end of the casing, the casing having second guiding elements connected to the longitudinal narrow sides, with the first and the second guiding elements being slidably connected such that the testing head is movable toward and attachable to the socket for establishing electrical contact; an evaluation circuit connected to the testing adaptor; at least one intermediate member inserted between the first and the second guiding elements, the intermediate member having a third guiding element and a fourth guiding element, the third and the fourth guiding elements being oppositely oriented relative to one another, with the third guiding element engaging one of the first guiding elements and the fourth guiding element engaging one of the second guiding elements.

It is thus suggested with the present invention that between a longitudinal narrow side of the casing of the testing adaptor and the neighboring inner side wall of the housing an intermediate member is inserted whereby a third guiding element of the intermediate member engages the first guiding element of the housing and whereby the fourth guiding element which is oppositely arranged relative to the third guiding element engages the second guiding element of the casing.

A testing device embodied according to this technical teaching has the advantage that the testing adaptor, in order to be adapted to a new circuit board arrangement, may be displaced without problems without necessitating the removal of the testing adaptor from this system. It is only required to remove the respective intermediate member so that the corresponding testing adaptor is freed and may be placed into the desired position corresponding to the given grid distance. Accordingly, the testing device may be adapted in a fast and simple manner to various circuit board arrangements to be tested without requiring a cumbersome handling of the testing adaptor.

In a preferred embodiment it is suggested that the first guiding elements are grooves, the second guiding elements are longitudinal ledges, the third guiding elements are ledges, and the fourth guiding elements are grooves. Of course, the four different guiding elements may be embodied in any other suitable fashion.

While in a basic version of the testing adaptor only one intermediate member is coordinated with a testing adaptor, whereby after removal of this intermediate member the testing adaptor must be displaced in its plane in order t subsequently move it perpendicular to that plane into its new position, in a preferred embodiment it is suggested that at each longitudinal narrow side of the testing adaptor one of the intermediate elements is provided. In this embodiment, both intermediate members must be removed in order to be able to displace the respective testing adaptor into its new position and subsequently the intermediate members must be inserted between adapter and housing into their respective new position.

It is preferred that the intermediate member is comprised of a base plate with a first and a second face, wherein the third guiding element is connected to the first face of the base plate and the second guiding element is connected to the second face of the base plate. The base plate essentially forms an abutment surface at the respective inner side wall of the housing.

In another preferred embodiment it is suggested that the third guiding element is laterally displaced relative to the fourth guiding element preferably by a distance corresponding to one fourth of the grid distance. This embodiment is advantageous because the positioning of the testing adaptor is not limited to the position of the first guiding elements at the housing, but due to the respective lateral displacement between third and fourth guiding element at the intermediate member intermediate positions of the testing adaptor may be provided. With this measure, the testing device may be adapted in a simple manner to specific divisions and distances of the circuit board to be tested.

According to one preferred embodiment, it is suggested that the lateral displacement corresponds to one fourth of the grid distance. In this context, it is especially expedient that the intermediate member may be insertable with either end between the side wall and the testing adaptor. This is especially advantageous because, due to such an embodiment of the intermediate member, positioning at half the grid distance may be accomplished. Accordingly, the application of the testing device is not restricted to the grid distance between the first guiding elements at the housing, but, due to the especially embodied intermediate member, the grid distance may be cut in half. This may be achieved with the same intermediate member since it is insertable in an identical fashion with both ends.

In a preferred embodiment, the intermediate member is in the form of a profiled aluminum stay, thereby allowing for its manufacture in a technically simple manner.

In another embodiment of the present invention, the intermediate member at its ends is provided with a respective opening. This is advantageous because with the aid of a respective pulling tool, for example, in the form of a pair of pliers, the intermediate member may be easily removed.

Expediently, the testing device of the present invention further comprises a connecting bar for connecting a plurality of intermediate members arranged one after another in a longitudinal direction of the side wall such that the intermediate members are removable from the housing in an upward direction by the connecting bar. The advantage of this embodiment is that all of the intermediate members on one side of the housing may be simultaneously removed in an upward direction by the connecting bar so that in a fast and simple manner a new arrangement of testing adapters within the housing according to a new application is possible. When only one individual intermediate member must be removed from the housing, the connecting bar is correspondingly moved such that the respective intermediate member is freed and is thus individually removable from the housing. This facilitates the handling of the testing device considerably. In order to provide a secure arrangement of the intermediate members at the housing, a fixation means is preferably provided for the connecting bar. For example, this may be in the form of a clamp connected to the housing.

In another embodiment it is suggested that the first guiding elements are in the form of plates connected to the side wall. Preferably, a plurality of such plates is arranged adjacent to one another at the side wall. Expediently, the plates are made of aluminum. The plates may be manufactured in a technically simple manner and allow the individual placement of the plates within the housing is possible. With this embodiment, a variable building block system is provided.

In a further advantageous embodiment of the present invention, each testing adaptor is provided with a pneumatic drive for sliding the testing adaptor along the intermediate members for attaching the testing head to the socket in order to establish electrical contact, respectively, for detaching the testing head. This pneumatic drive is advantageous because the testing adaptor may be placed onto the socket to be tested in a manner similar to a placement by hand without running the risk that the forces applied are to great in view of the fact that the circuit boards are very fragile and may break under a great force load. Of course, the pneumatic drive furthermore simplifies the handling of the testing device. In a further development the pneumatic drive comprises a cylinder housing, detachably connected to the housing, and a piston, fixedly connected to the testing adaptor. This is advantageous because, due to the pneumatic drive, the testing adaptor may be moved into its contacting position as well as into the non-contacting position in a technically simple manner. The pneumatic drive forms a unit with the casing of the testing adaptor, that is, it is fixedly connected to the casing. Since the pneumatic drive is detachably connected to the housing, a new positioning of the testing adaptor may be accomplished after detaching the pneumatic drive and removing the intermediate member.

In a further embodiment of the cylinder housing of the pneumatic drive, the cylinder housing is connected to the housing by a bayonet closure. This means that, for example, in the longitudinal direction of the housing respective rails are provided in which respective projections of the pneumatic drive are form-locked after a respective rotational movement of the pneumatic drive.

Accordingly, it is possible to detach the pneumatic drive in a fast manner from the testing adaptor.

In another embodiment of the present invention it is preferable to provide the testing head in an exchangeable manner.

DESCRIPTION OF PREFERRED EMBODIMENTS

The present invention will now be described in detail with the aid of several specific embodiments utilizing FIGS. 1 through 5.

Figure 2:
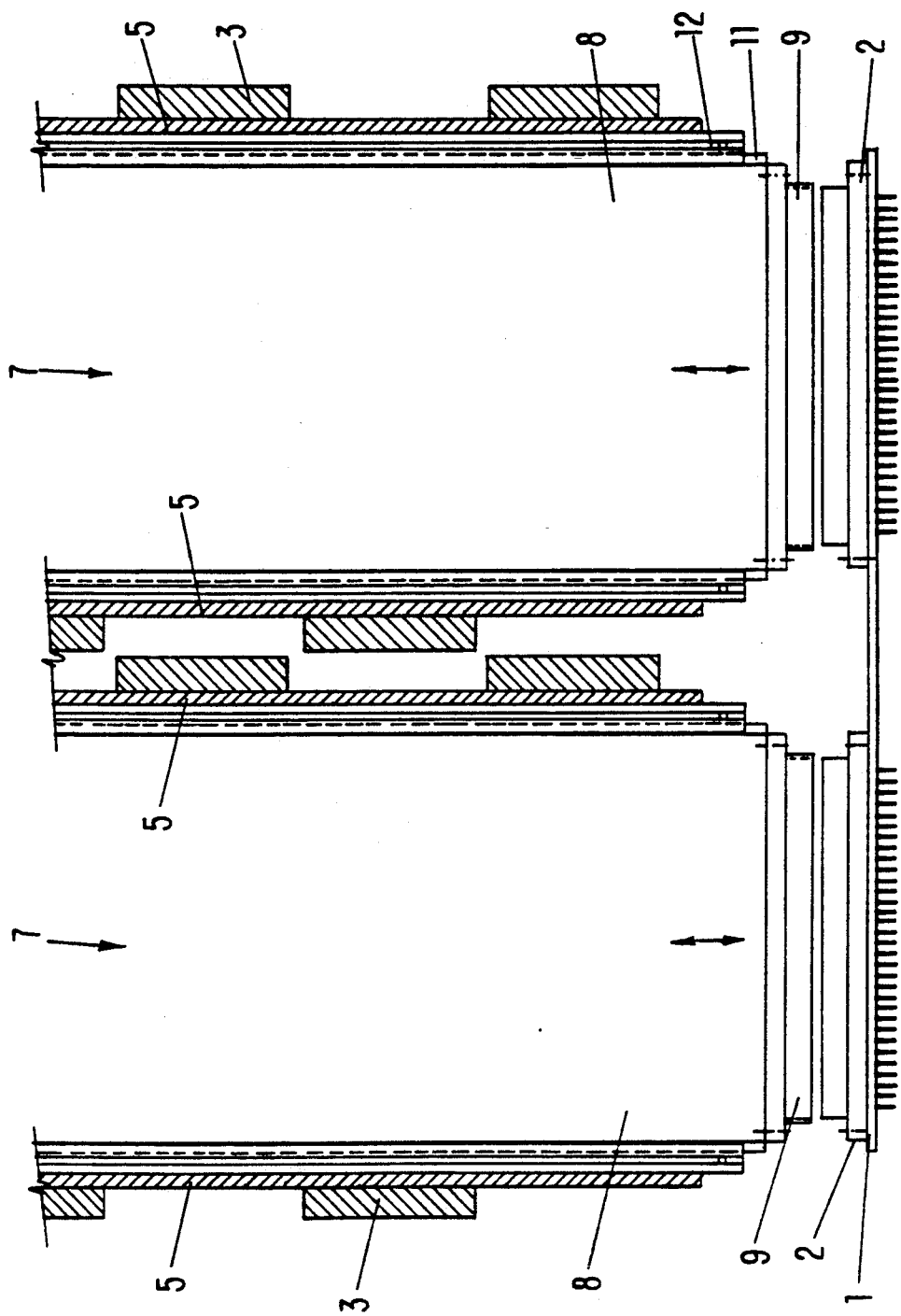
FIG. 2 is a side view of the testing device according to FIG. 1.

The first embodiment of the testing device represented in FIGS. 1 and 2 for testing contacting and/or wiring of sockets 2 connected to a circuit board 1 in a two-row array, the sockets serving for contacting insertable electronic cards, is comprised of two essentially parallelepipedal housings 3, whereby a first housing 3 corresponds to the first row of sockets 2 and the second housing 3 corresponds to the second row of sockets 2. At the oppositely arranged inner side walls 4 that extend in the longitudinal direction of the housing plates 5 made of aluminum are arranged one after another. These plates 5 are provided with guiding elements in the form of guiding grooves 6 that are parallel to one another. The guiding grooves 6 form a grid with a certain grid distance R which, for example, may be 5.08 mm.

Figure 3:
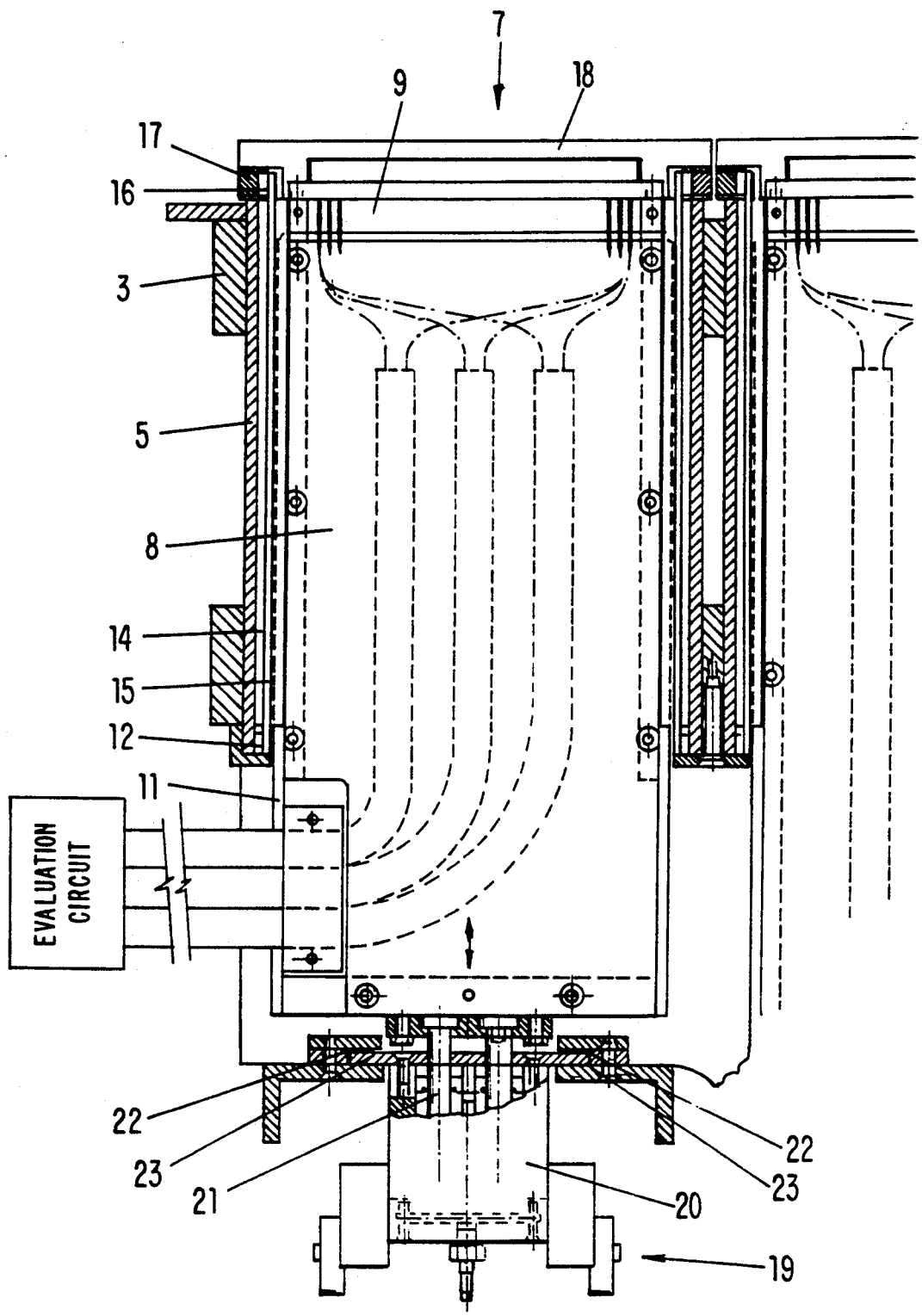
FIG. 3 is a schematic side view of a second embodiment of the inventive testing device.

Within the housings 3 testing adapters 7 are arranged via which the sockets 2 are to be tested. These testing adapters 7 each are comprised of an essentially parallelepipedal casing 8 for receiving the evaluation circuit or switching electronics, (40) as shown in FIG. 3 or, alternatively, for receiving only the wiring for an externally arranged evaluation circuit or switching electronics. At the forward end a testing head 9 that is preferably exchangeable is provided. The testing head 9 is provided with pins or spring contacts which form the electrical connection to the corresponding contacts of the socket 2 to be tested. At both longitudinal narrow sides 10 the casings 8 are provided with guiding elements 11 in the form of longitudinal edges.

For positioning the testing adaptor 7 within the housing 3 at the desired location, intermediate members 12 which are essentially rail-shaped are provided. The intermediate members 12 have a base plate 13 with a first and a second face 13a, 13b. To the first face 13a a third guiding element in the form of a ledge 14 is connected, and to the second face 13b a fourth guiding element 15 in the form of a groove is connected. Between the ledge 14 and the groove 15 a lateral displacement V exists which corresponds to one fourth of the grid distance R.

For positioning the testing adaptor 7 within the housing 3, the intermediate members 12 are inserted from the top between the two longitudinal narrow sides 10 of the casing 8 and the respectively oppositely arranged plates 5 such that the ledge 14 of the intermediate member 12 is placed into the guiding groove 6 of the plate 5 and the longitudinal ledge 11 of the casing 8 is placed into the groove 15 of the intermediate member 12. As can be seen from the drawings, the intermediate member 12 may be inserted with its first or second end into the housing. This has the effect that the displacement V of the groove 15 with respect to the ledge 14 of the intermediate member 12 is arranged to the left or to the right in the drawing. Since the displacement V corresponds to one fourth of the grid distance R, it is possible to position the testing adapter 7 at half the grid distance R.

Accordingly, in the drawings two neighboring testing adapters 7 are indicated which are spaced from one another at three times the grid distance R while adjacent thereto the testing adapters 7 have a distance of 3.5 times the grid distance R. By respectively inserting the intermediate member 12 with its first or its second end, it is thus possible to position the testing adaptor 7 at half the grid distance R within the housing 3.

The testing device functions as follows:

For testing the sockets 2, the two housings 3 are arranged above the circuit board 1 with the sockets 2. After the testing adapters 7 have been correctly positioned relative to the sockets 2, they are pneumatically moved in a downward direction such that the respective testing heads 9 are attached to the sockets 2, thereby establishing electrical contact, so that the respective testing measurements may be performed. After the testing is complete, the testing adaptor 7 are moved in an upward direction.

If it is desired to test a circuit board 1 with a different arrangement of sockets 2, the testing adapters 7 must be correspondingly displaced within the housings 3. For this purpose, it is necessary to remove the two intermediate members 12 of the slidable testing adapters 7 in an upward direction and subsequently displace the testing adaptor 7 within the housings 3 without actually having to remove the testing adaptor 7 itself from the housing 3. After the displacement of the testing adaptor 7 into the correct position, it is thus only necessary to insert the two intermediate members 12 with the correct orientation of the displacement V.

In the represented embodiment, the inner side walls 4 of the housing 3 are provided with guiding grooves 6 at the plates 5 and the testing adapters 7 have longitudinal ledges 11. Correspondingly, the intermediate members 12 are provided with ledges 14 and grooves 15. However, it is also possible that these components are provided with different groove/ledge, groove/groove, or ledge/ledge combinations. It is only required that between the testing adapters 7, the intermediate members 12, and the inner side walls 4 of the housings 3 cooperating guiding elements in the form of profilings such as grooves or ledges are provided.

A second embodiment is represented in FIGS. 3 to 5. This testing device differs from the first embodiment represented in FIGS. 1 and 2 only in two features and thus represents a further development of the first embodiment so that in the following only the two novel features will be explained in detail while with respect to other constructive details reference is made to the first embodiment.

As can be seen especially in the representation according to FIG. 4, the intermediate members 12 at their upper ends are provided with outwardly protruding projections 16, whereby these projections 16 of the intermediate members 12 arranged on one side of the housings 3 are flush relative to one another. Onto these projections 16 of the upper ends of the intermediate members 12, a connecting bar 17 is positioned alongside the housing wall and connects the projections 16 with one another. It can be taken from FIG. 4 that the connecting bar 17 engages the projections 16 from behind so that in the longitudinal direction of the intermediate members 12 a form-locking connection is achieved. This means that when the connecting bar 17 is moved in an upward direction all of the inserted intermediate members 12 are also displaced and thus removed from the housing 3. It is thus possible to remove all of the intermediate members 12 from the housing 3 in a simple and fast fashion in order to, for example, perform a new positioning of the testing adaptor 7. When it is desired to remove only a certain intermediate member 12, the connecting bar 17 is moved in its longitudinal direction until the particular intermediate member 12 is freed and is thus individually removable. For securing the connecting bar 17 at the housing 3 and thus for the fixation of the position of the intermediate members 12, an arresting means 18 is fixedly connected to the housing 3 which prevents that the connecting bar 17 may be moved in an upward direction. However, the arresting means 18 is removable, if necessary.

Furthermore, each testing adaptor 7 is provided with a pneumatic drive 19. This pneumatic drive 19 is comprised of a cylinder housing 20 and a piston 21. The piston 21 is fixedly connected to the bottom side of the casing 8, and the cylinder housing 20 of the pneumatic drive 19 is connected to the bottom portion of the housing 3 in a releasable manner, but in its operating position is fixedly connected to the housing 3. For this purpose, the bottom portion of the housing 3 is provided with rails or grooves 22 extending in the longitudinal direction which, as can be seen in FIG. 3, are aligned with one another. The cylinder housing 20 is provided with oppositely arranged projections or wings 23 corresponding to the rails or grooves 22. The wings 23 are embodied such that they may be inserted into the rails or grooves 22 in the form of a bayonet closure. For this purpose, the unit comprised of the testing adaptor 7 and the pneumatic drive 19 is inserted slightly rotated relative to the housing 3 so that the wings 23 of the cylinder housing 20 are still outside of the rails or grooves 22, but in a neighboring position. By rotating the testing adaptor 7 and the pneumatic drive 19, the wings 23 are inserted into the grooves 22 so that, viewed in the longitudinal direction of the intermediate member 12, they are form lockingly held within the grooves 22. This operating position is shown in the drawings.

By actuating the pneumatic drive 19, the testing adaptor 7 (FIG. 3) is moved in an upward direction so that the respective contact is accomplished. The pneumatic drive 19 is controlled such that the contacting is carried out as if performed by hand without the forces due to contacting acting on the circuit 1 becoming excessive, thereby preventing breakage For releasing the contact, the piston 21 of the pneumatic drive 19 is moved in the other direction. When it is desired to remove the testing adapters 7 from the housing 3 it is only necessary, after removal of the intermediate member 12, to rotate the testing adaptor/pneumatic drive unit 7, 19 slightly about their longitudinal axis, so that the wings 23 are freed and remove the unit from the housing 3

The present invention is, of course, in no way restricted to the specific disclosure of the specification, examples and drawings, but also encompasses any modifications within the scope of the appended claims.

What I claim is:

1. A device for testing contacting and/or wiring of sockets arranged in an array on a circuit board, said device comprising:
   a housing with oppositely arranged inner side walls;
   parallel first guiding elements connected to said inner side walls and spaced at a certain grid distance from one another;
   at least one testing adapter connected to said housing for testing one of the sockets, said testing adapter comprising a flat casing with a forward end and opposite longitudinal narrow sides, and a testing head connected to said forward end of said casing, said casing having second guiding elements connected to said longitudinal narrow sides, with said first and said second guiding elements being slidably connected such that said testing head is movable toward and attachable to the socket for establishing electrical contact;
   an evaluation circuit connected to said testing adapter;
   at least one intermediate member inserted between said first and said second guiding elements, said intermediate member having a third guiding element and a fourth guiding element, said third and said fourth, guiding elements being oppositely oriented relative to one another, with said third guiding element engaging one of said first guiding elements and said fourth guiding element engaging one of said second guiding elements.

2. A device according to claim 1, wherein said first guiding elements are grooves, said second guiding elements are longitudinal ledges said third guiding elements are ledges, and said fourth guiding elements are grooves.

3. A device according to claim 1, wherein on each said longitudinal narrow sides of said testing adapter one of said intermediate elements is provided.

4. A device according to claim 1, wherein said intermediate member is comprised of a base plate with a first and a second face, and wherein said third guiding element is connected to a first face of said base plate and said second guiding element is connected to a second face of said base plate.

5. A device according to claim 4, wherein said third guiding element is laterally displaced relative to said fourth guiding element.

6. A device according to claim 5, wherein said third guiding element is displaced by a distance corresponding to one fourth of said grid distance.

7. A device according to claim 5, wherein said intermediate member has two ends and is insertable with either one of said ends.

8. A device according to claim 1, wherein said intermediate member is a profiled aluminum stay.

9. A device according to claim 1, wherein said intermediate member, at ends thereof, is provided with an opening.

10. A device according to claim 1, further comprising a connecting bar for connecting a plurality of said intermediate members arranged in a longitudinal direction of said side wall one after another such that said intermediate members are removable from said housing in an upward direction by said connecting bar.

11. A device according to claim 1, further comprising plates connected to said side walls, said plates having profilings that form said first guiding elements.

12. A device according to claim 11, wherein a plurality of said plates are arranged adjacent one another at said side wall.

13. A device according to claim 11, wherein said plates are made of aluminum.

14. A device according to claim 1, further comprising a pneumatic drive for each said testing adapter for sliding said testing adapter along said intermediate members for attaching said testing head to the socket in order to establish electrical contact.

15. A device according to claim 14, wherein said pneumatic drive furthermore removes said testing adapter from the socket.

16. A device according to claim 14, wherein said pneumatic drive comprises a cylinder housing, detachably connected to said housing, and a piston, fixedly connected to said testing adapter.

17. A device according to claim 16, further comprising a bayonet closure for connecting said cylinder housing to said housing.

18. A device according to claim 1, wherein said testing head is connected to said testing adapter in an exchangeable manner.

* * * * *